(12) United States Patent
Akiyama (10) Patent No.: US 12,183,859 B2
(45) Date of Patent: Dec. 31, 2024

(54) LIGHT SOURCE APPARATUS AND PROJECTOR

(71) Applicant: SEIKO EPSON CORPORATION, Tokyo (JP)

(72) Inventor: Koichi Akiyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 514 days.

(21) Appl. No.: 17/592,565

(22) Filed: Feb. 4, 2022

(65) Prior Publication Data

US 2022/0254964 A1 Aug. 11, 2022

(30) Foreign Application Priority Data

Feb. 5, 2021 (JP) .................................. 2021-017266

(51) Int. Cl.
*H01L 33/50* (2010.01)
*G03B 21/20* (2006.01)
*H01L 33/58* (2010.01)

(52) U.S. Cl.
CPC .......... *H01L 33/502* (2013.01); *G03B 21/204* (2013.01); *H01L 33/58* (2013.01)

(58) Field of Classification Search
CPC ...... G03B 21/204; H01L 33/58; H01L 33/502
See application file for complete search history.

(56) References Cited

U.S. PATENT DOCUMENTS

| 2008/0123343 | A1 | 5/2008 | Kobayashi et al. |
| 2015/0029466 | A1* | 1/2015 | Sakata ................. G03B 21/208 362/268 |
| 2018/0067389 | A1 | 3/2018 | Kikuma et al. |
| 2020/0033708 | A1 | 1/2020 | Akagawa |

FOREIGN PATENT DOCUMENTS

| JP | 2008-026853 | 2/2008 |
| JP | 2008-112114 | 5/2008 |
| JP | 2013-250494 | 12/2013 |
| JP | 2018-40935 | 3/2018 |
| JP | 2020-21540 | 2/2020 |

* cited by examiner

*Primary Examiner* — Karabi Guharay
(74) *Attorney, Agent, or Firm* — Dority & Manning, P.A.

(57) ABSTRACT

A light source apparatus includes a light source, a wavelength conversion layer, a substrate, a first optical member having a first optical layer that transmits first light and reflects second light, second and third optical members having second and third optical layers that reflect the first light and the second light and intersect with the first optical layer, and a fourth optical layer reflects the first light and transmits the second light. The first optical member includes a fifth optical layer that transmits the first light polarized is a first direction. The first optical layer reflects part of the first light emitted from the wavelength conversion layer. First area of a light incident surface of the wavelength conversion layer is greater than second area of a light incident region of the light incident surface. The second area of the light incident region is greater than third area of an aperture.

5 Claims, 4 Drawing Sheets

LIGHT SOURCE APPARATUS AND PROJECTOR

The present application is based on, and claims priority from JP Application Serial Number 2021-017266, filed Feb. 5, 2021, the disclosure of which is hereby incorporated by reference herein in its entirety.

BACKGROUND

1. Technical Field

The present disclosure relates to a light source apparatus and a projector.

2. Related Art

As a light source apparatus used in a projector, there is a light source apparatus that performs high-luminance illumination on an illumination receiving object, such as a liquid crystal panel, by reducing the etendue of the illumination light (see JP-A-2008-026853 and JP-A-2008-112114, for example). In recent years, as a light source apparatus used in a projector, there is also a light source apparatus using fluorescence generated by an excited phosphor as the illumination light.

In general, reducing an area of a phosphor, the area on which the excitation light is incident, allows reduction is the etendue of the resultant fluorescence. Reducing the area on which the excitation light is incident increases, however, the optical density of the excitation light, resulting in a problem of a decrease in the fluorescence conversion efficiency.

As described above, it is difficult in related art to reduce the etendue with an increase in the optical density of the excitation light suppressed.

SUMMARY

To solve the problem described above, according to an aspect of the present disclosure, there is provided a light source apparatus including a light source configured to emit first light having a first wavelength band, a wavelength conversion layer having a light incident surface, the wavelength conversion layer being configured to convert the first light which is incident on the light incident surface into second light having a second wavelength band different from the first wavelength band, a substrate having a support surface configured to support the wavelength conversion layer, a first optical member including a first optical layer configured to transmit the first light emitted from the light source and reflect the second light, the first optical layer facing the support surface, a second optical member having a second optical layer configured to reflect the first light and the second light, the second optical layer intersecting with the support surface and the first optical layer, a third optical member having a third optical layer configured to reflect the first light and the second light, the third optical layer intersecting with the support surface and the first optical layer and facing the second optical layer, and a fourth optical layer configured to cover an aperture formed by the substrate, the first optical member, the second optical member, and the third optical member, the fourth optical layer being configured to reflect the first light and transmit the second light. The first light emitted from the light source is polarized in a first direction. The first optical member includes a fifth optical layer provided on a side facing the light source, the fifth optical layer being configured to transmit the first light polarized in the first direction. The first optical layer is provided on a side facing the wavelength conversion layer in the first optical member and is configured to reflect part of the first light emitted from the wavelength conversion layer. The fifth optical layer is configured to reflect the first light polarized in a second direction different from the first direction. A first area of the light incident surface of the wavelength conversion layer is greater than a second area of a light incident region, of the light incident surface, on which the first light is incident. The second area of the light incident region is greater than a third area of the aperture.

According to a second aspect of the present disclosure, there is provided a projector including the light source apparatus according to the first aspect of the present disclosure, a light modulator modulating light from the light source apparatus, and a projection optical apparatus projecting the light modulated by the light modulator.

DESCRIPTION OF EXEMPLARY EMBODIMENTS

An embodiment of the present disclosure will be described below in detail with reference to the drawings.

In the drawings used in the description below, a characteristic portion is enlarged for convenience in some cases for clarity of the characteristic thereof, and the dimension ratio and other factors of each component are therefore not always equal to actual values.

An example of a projector according to the present embodiment will be described.

Figure 1:
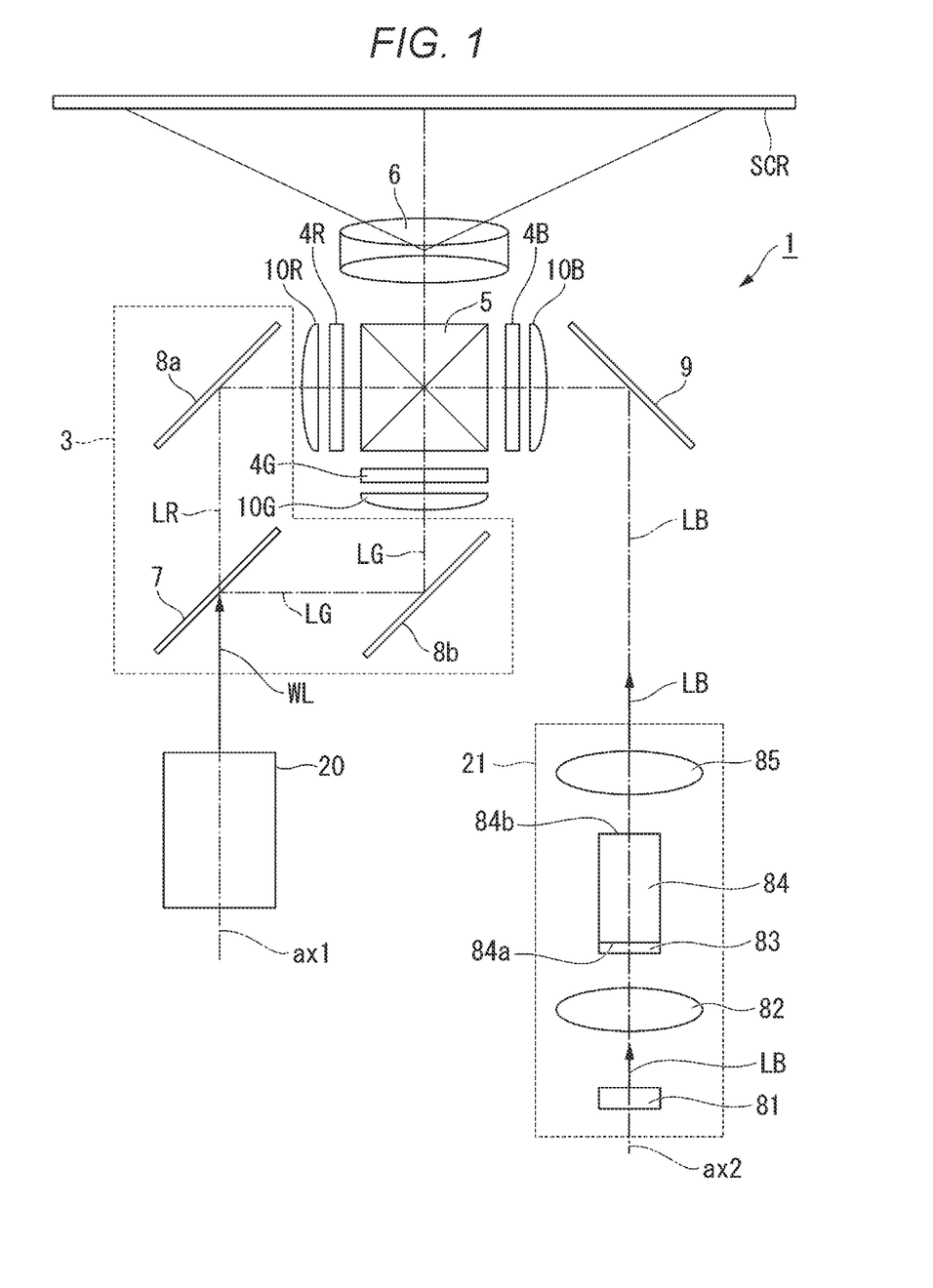
FIG. 1 shows a schematic configuration of a projector according to an embodiment.

FIG. 1 shows a schematic configuration of the projector according to the present embodiment.

A projector 1 according to the present embodiment is a projection-type image display apparatus that displays color video images on a screen SCR, as shown in FIG. 1. The projector 1 includes a color separation system 3, light modulators 4R, 4G, and 4B, a light combining system 5, a projection optical apparatus 6, a first light source apparatus (light source apparatus) 20, and a second light source apparatus 21. The first light source apparatus 20 corresponds to an embodiment of the light source apparatus according to the present disclosure.

The color separation system 3 separates yellow illumination light WL into red light LR and green light LG. The color separation system 3 includes a color separation mirror 7, a first reflection mirror 8a, and a second reflection mirror 8b.

The color separation mirror 7 is formed of a dichroic mirror that separates the illumination light WL from the first light source apparatus 20 into the red light LR and the green light LG. The color separation mirror 7 transmits the red light LR and reflects the green light LG out of the illumination light WL. The second reflection mirror 8b reflects the green light LG toward the light modulator 4G. The first reflection mirror 8a is disposed in the optical path of the red light LR and reflects the red light LR having passed through the color separation mirror 7 toward the light modulator 4R.

On the other hand, blue light LB from the second light source apparatus 21 is reflected off a reflection mirror 9 toward the light modulator 4B.

The configuration of the second light source apparatus 21 will now be described.

The second light source apparatus 21 includes a second light source 81, a focusing lens 82, a diffuser plate 83, a rod lens 84, and a relay lens 85. The second light source 81 is formed of at least one semiconductor laser and outputs the blue light LB formed of laser light. The second light source 81 is not limited to a semiconductor laser and may be an LED that outputs blue light.

The focusing lens 82 is formed of a convex lens and causes the blue light LB to be incident on the diffuser plate 83 with the blue light LB substantially focused thereon. The diffuser plate 83 diffuses the blue light LB from the second light source 81 at a predetermined degree of diffusion to generate blue light LB having a uniform light orientation distribution close to that of the illumination light WL outputted from the first light source apparatus 20. The diffuser plate 83 can, for example, be a ground glass plate made of optical glass.

The blue light LB diffused by the diffuser plate enters the rod lens 84. The rod lens 84 has a quadrangular columnar shape extending along an illumination optical axis ax2 of the second light source apparatus 21 and has a light incident end surface 84a provided at one end and a light exiting end surface 84b provided at the other end. The diffuser plate 83 is fixed to the light incident end surface 84a of the rod lens 84 via an optical adhesive that is not shown. It is desirable that the refractive index of the diffuser plate 83 matches as much as possible with the refractive index of the rod lens 84.

The blue light LB propagates through the rod lens 84 while being totally reflected therein and exits via the light exiting end surface 84b with the illuminance distribution uniformity of the blue light LB improved. The blue light LB having exited out of the rod lens 84 enters the relay lens 85. The relay lens 85 causes the blue light LB having the illuminance distribution uniformity improved by the rod lens 84 to be incident on the reflection mirror 9.

The light exiting end surface 84b of the rod lens has a rectangular shape substantially similar to the shape of an image formation region of the light modulator 4B. The blue light LB having exited out of the rod lens 84 is thus efficiently incident on the image formation region of the light modulator 4B.

The light modulator 4R modulates the red light LR in accordance with image information to form image light corresponding to the red light LR. The light modulator 4G modulates the green light LG in accordance with image information to form image light corresponding to the green light LG. The light modulator 4B modulates the blue light LB in accordance with image information to form image light corresponding to the blue light LB.

The light modulators 4R, 4G, and 4B are each, for example, a transmissive liquid crystal panel. Polarizers that are not shown are disposed on the light incident side and the light exiting side of each of the liquid crystal panels and configured to transmit only linearly polarized light polarized in a specific direction.

Field lenses 10R, 10G, and 10B are disposed on the light incident sides of the light modulators 4R, 4G, and 4B, respectively. The field lenses 10R, 10G, and 10B parallelize the red light LR, the green light LG, and the blue light LB to be incident on the respective light modulators 4R, 4G, and 4B.

The light combining system 5 receives the image light outputted from the light modulators 4R, 4G, and 4B, combines the image light corresponding to the red light LR, the image light corresponding to the green light LG, and the image light corresponding to the blue light LB with one another, and outputs the combined image light toward the projection optical apparatus 6. The light combining system 5 is, for example, a cross dichroic prism.

The projection optical apparatus 6 is formed of a plurality of lenses. The projection optical apparatus 6 enlarges the combined image light from the light combining system 5 and projects the enlarged image light toward the screen SCR. An image is thus displayed on the screen SCR.

First Light Source Apparatus

Figure 2:
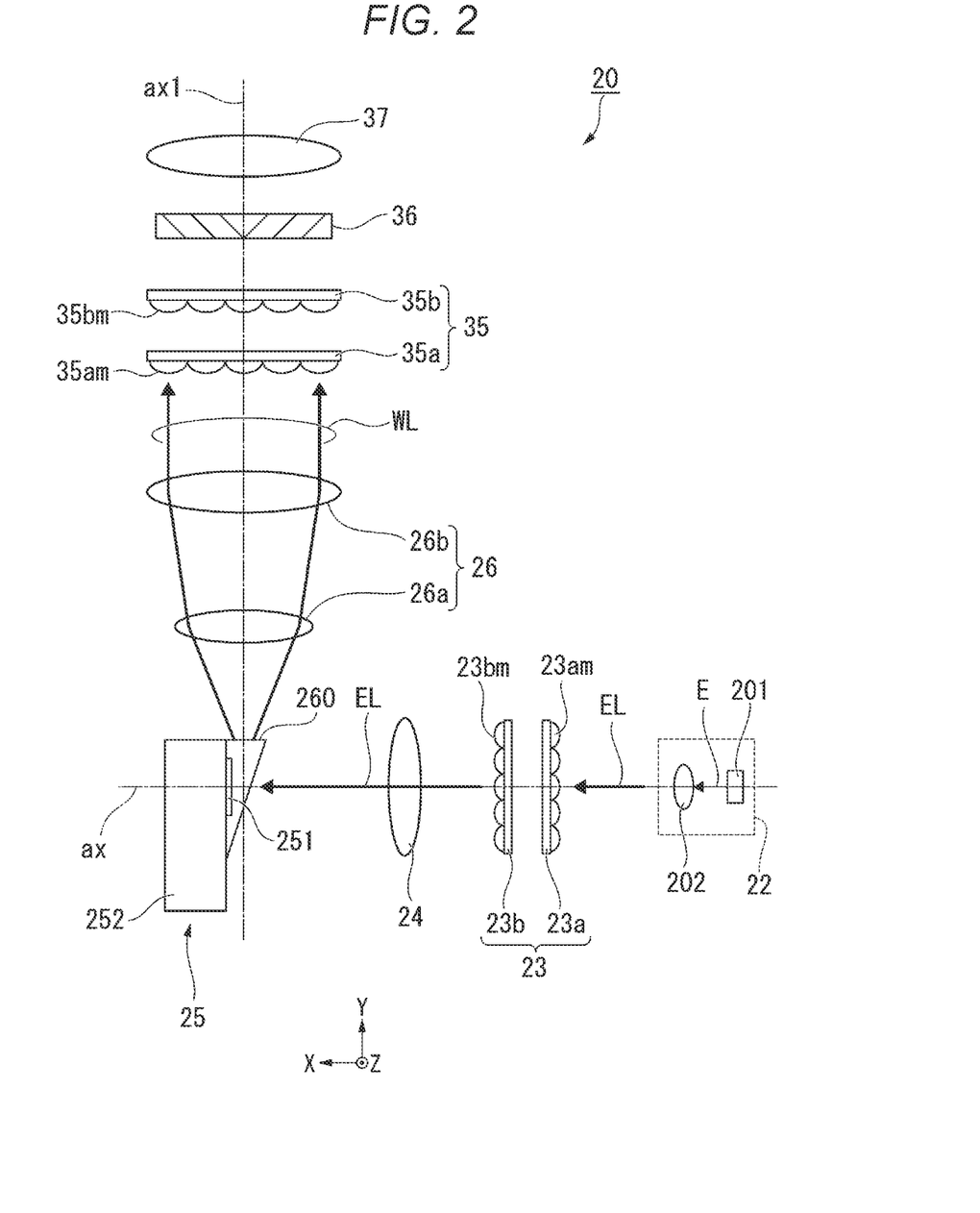
FIG. 2 is a schematic configuration diagram of a first light source apparatus.

FIG. 2 is a schematic configuration diagram of the first light source apparatus 20.

In the following drawings including FIG. 2, each component of the first light source apparatus 20 will be described by using an XYZ coordinate system as required. The axis X is an axis parallel to an optical axis ax of a light source 22, the axis Y is an axis parallel to an illumination optical axis an perpendicular to the optical axis ax, and the axis Z is an axis perpendicular to the axes X and Y. That is, the optical axis ax and the illumination optical axis ax1 are present in the same plane, and the optical axis ax is perpendicular to the illumination optical axis ax1.

The first light source apparatus 20 includes the light source 22, a homogenizer optical system 23, a focusing optical system 24, a wavelength converter 25, a pickup optical system 26, an optical integration system 35, a polarization converter 36, and a superimposing lens 37, as shown in FIG. 2.

The light source 22 includes a light emitter 201 and a collimation lens 202. The light emitter 201 is formed of a semiconductor laser. The light emitter 201 outputs a luminous flux E formed of light beams having a peak wavelength of, for example, 445 nm. A semiconductor laser that outputs the luminous flux E having a wavelength other than 445 nm can instead be used as the light emitter 201. For example, the light emitter 201 may output a luminous flux E formed of light beams having a peak wavelength of 460 nm. The luminous flux E is linearly polarized light.

The collimation lens 202 is disposed in correspondence with the light emitter 201. The collimation lens 202 converts the luminous flux E outputted from the light emitter 201 into parallelized light. The number of light emitters 201 and collimation lenses 202 is not limited to a specific number.

The light source 22 thus outputs excitation light (light having first wavelength band) EL in the form of a parallelized luminous flux having a blue wavelength band (first wavelength band). In the present embodiment, the light source 22 outputs linearly polarized light as the excitation light EL.

In the first light source apparatus 20 according to the present embodiment, the light source 22, the homogenizer optical system 23, the focusing optical system 24, and the wavelength converter 25 are arranged along the optical axis ax of the light source 22.

The excitation light EL outputted from the light source 22 enters the homogenizer optical system 23. The homogenizer optical system 23 is formed, for example, of a lens array 23a and a lens array 23b. The lens array 23a includes a plurality of lenslets 23am, and the lens array 23b includes a plurality of lenslets 23bm.

The lens array 23a separates the excitation light EL into a plurality of thin light ray bundles. The lenslets 23am of the lens array 23a each bring the thin light ray bundle into focus at the corresponding lenslet 23bm of the lens array 23b. The lens array 23b, along with the focusing optical system 24, which will be described later, superimposes images of the lenslets 23am of the lens array 23a on a phosphor layer 251 of the wavelength converter 25. The focusing optical system 24 cooperates with the homogenizer optical system 23 to homogenize the illuminance distribution of the excitation light EL incident on the phosphor layer 251 of the wavelength converter 25. The focusing optical system 24 is formed of a single lens or a plurality of lenses.

The wavelength converter 25 includes the phosphor layer 251, which generates fluorescence YL when excited by the excitation light EL incident from the light source 22 toward the side +X, and a substrate 252, which supports the phosphor layer 251. The wavelength converter 25 outputs the generated fluorescence YL toward the side +Y via an aperture 260.

Figure 3:
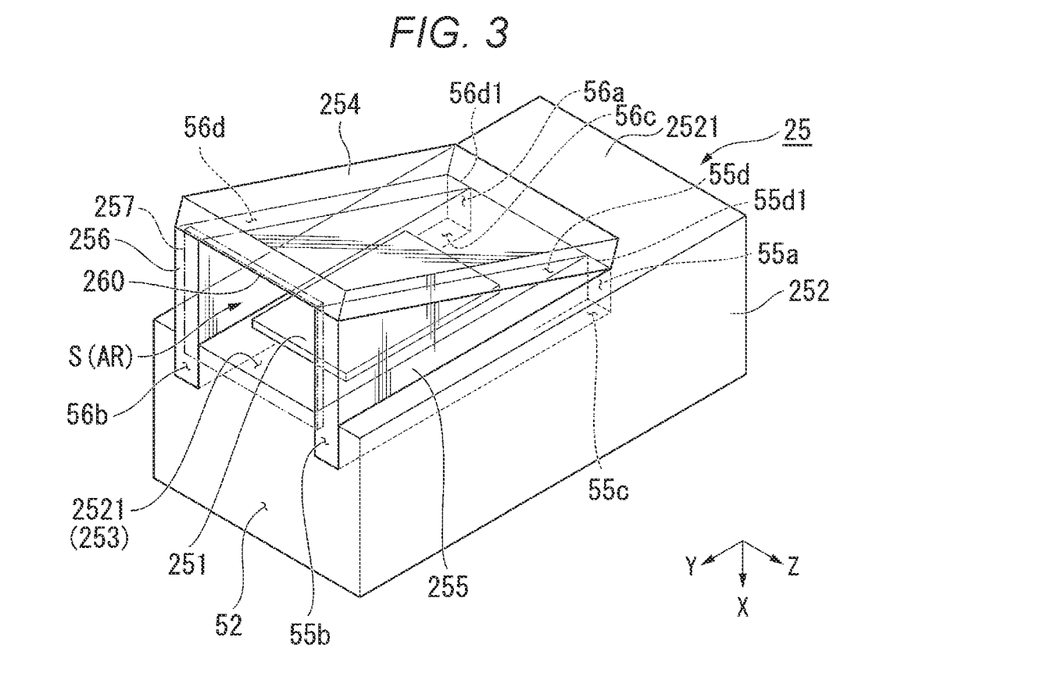
FIG. 3 is a perspective view showing the configurations of key parts of a wavelength converter.
Figure 4:
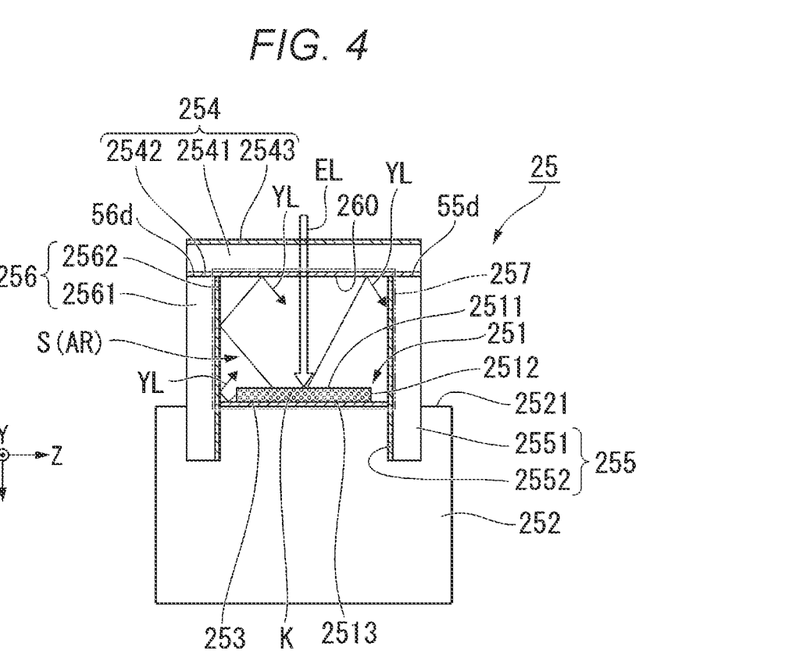
FIG. 4 is a front view of the wavelength converter viewed from a side +Y.
Figure 5:
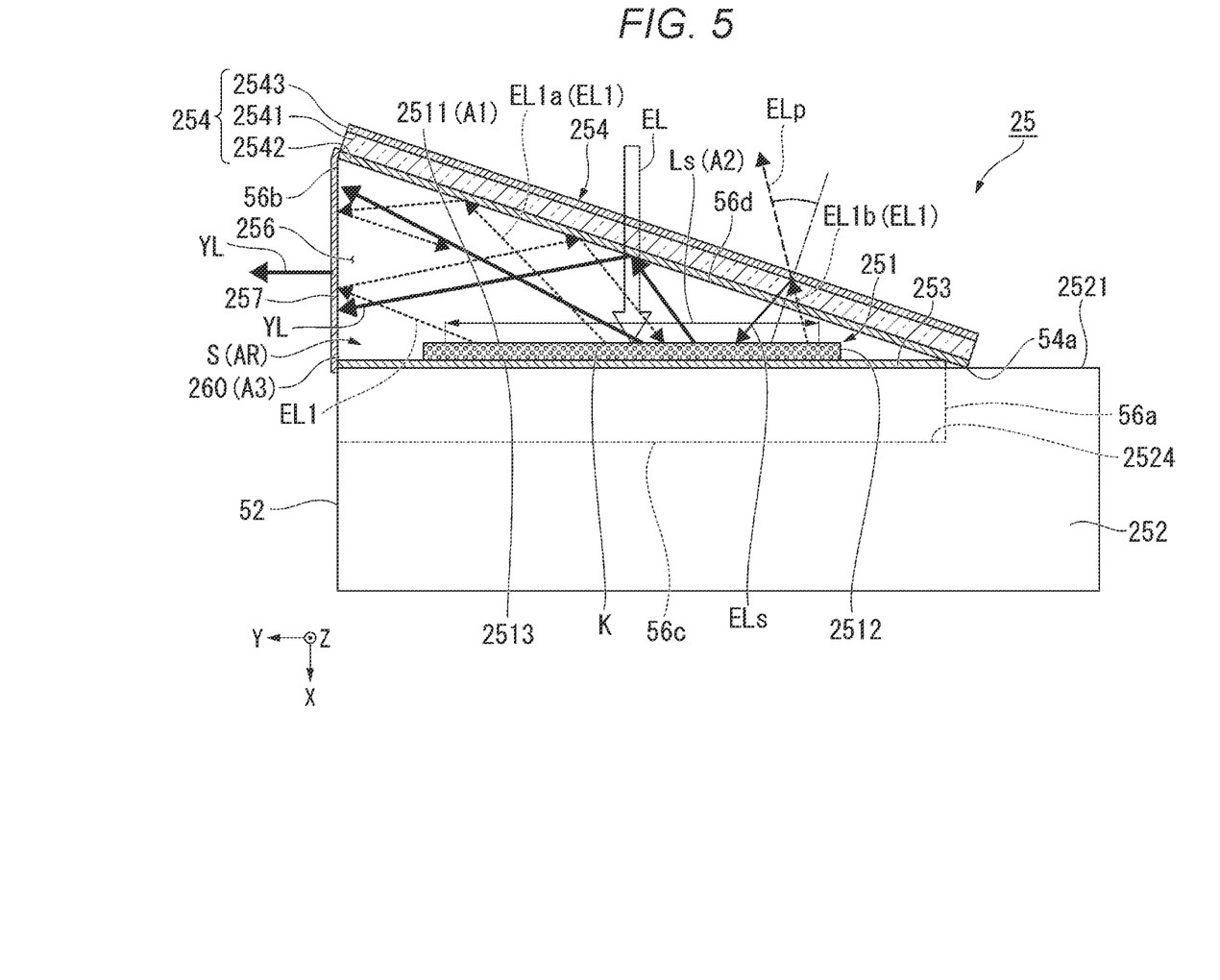
FIG. 5 is a cross-sectional view of the wavelength converter taken along a plane XY.

The configuration of the wavelength converter 25 will subsequently be described in detail. FIG. 3 is a perspective view showing the configurations of key parts of the wavelength converter 25. FIG. 4 is a front view of the wavelength converter 25 viewed from the side +Y. FIG. 5 is across-sectional view of the wavelength converter 25 taken along the plane XY.

The wavelength converter 25 in the present embodiment includes the phosphor layer (wavelength conversion layer) 251, the substrate 252, a mirror layer 253, a first optical member 254, a second optical member 255, a third optical member 256, and a fourth optical layer 257, as shown in FIGS. 3 to 5. The wavelength converter 25 has the aperture 260, via which the fluorescence YL generated by the phosphor layer 251 exits. The aperture 260 is provided on the side +Y of the wavelength converter 25.

The aperture 260 in the present embodiment is an aperture formed by the +Y-side end surfaces of the substrate 252, the first optical member 254, the second optical member 255 and the third optical member 256.

In the wavelength converter 25 in the present embodiment, the fourth optical layer 257 is provided so as to cover the aperture 260. The fourth optical layer 257 is formed of a dichroic layer characterized in that it transmits the fluorescence YL having the yellow wavelength band and reflects light having the blue wavelength band to which the excitation light EL belongs. The fourth optical layer 257, which covers the aperture 260, therefore does not block the fluorescent YL emitted via the aperture 260.

The phosphor layer 251 contains phosphor particles that are excited by the excitation light EL and emit the fluorescence having the yellow wavelength band (light having second wavelength band) YL. The phosphor layer 251 generates the fluorescence YL by converting the excitation light EL in terms of wavelength.

The phosphor layer 251 is a plate-shaped phosphor having a front surface (light incident surface) 2511, a side surface 2512, and a rear surface 2513. The front surface 2511 is the surface on which the excitation light EL is incident. The side surface 2512 is a surface that intersects with the front surface 2511. The side surface 2512 may be perpendicular to the front surface 2511. The rear surface 2513 is the surface opposite from the front surface 2511.

The phosphor particles can, for example, be yttrium-aluminum-garnet-based (YAG-based) phosphor particles. The phosphor particles may be made of one type of material, or a mixture of particles made of two or more materials may be used as the phosphor particles. The phosphor layer 251 may, for example, be a phosphor layer in which the phosphor particles are dispersed in an inorganic binder, such as alumina, or a phosphor layer containing sintered phosphor particles with no binder. The phosphor layer 251 in the present embodiment contains a plurality of pores (scatterers) K.

The phosphor layer 251 is supported by the substrate 252. The substrate 252 has a support surface 2521, which supports the phosphor layer 251. The support surface 2521 is a surface parallel to the plane YZ. The substrate 252 is thermally connected to the phosphor layer 251. The substrate 252 is, for example, a substrate made of metal that excels in heat dissipation, such as aluminum and copper. The substrate 252, which is thermally connected to the phosphor layer 251, dissipates the heat of the phosphor layer 251 to cool the phosphor layer 251.

In the wavelength converter 25, the phosphor layer 251 is accommodated in an accommodation space S. The accommodation space S is a space surrounded by the substrate 252, the first optical member 254, the second optical member 255, and the third optical member 256. The accommodation space S is provided on the side inward from the opening 260. The accommodation space S provided with an air layer AR.

The mirror layer 253 is provided between the substrate 252 and the phosphor layer 251. The area of the mirror layer 253 is greater than the area of the rear surface 2513 of the phosphor layer 251. In the present embodiment, the mirror layer 253 is provided on the support surface 2521 located in the accommodation space S. That is, the mirror layer 253 is provided around the phosphor layer 251 at the support surface 2521 of the substrate 252. The phosphor layer 251 is bonded to the support surface 2521 of the substrate 252 via the mirror layer 253. The mirror layer 253 is formed, for example, of a metal or dielectric layer. The mirror layer 253 may be provided across the entire support surface 2521, that is, so as to cover the region outside the accommodation space S. Part of the mirror layer 253 may be formed directly at the rear surface 2513 of the phosphor layer 251.

The first optical member 254 is disposed so as to face the support surface 2521 of the substrate 252. That is, the first optical member 254 is disposed so as to face the front surface 2511 of the phosphor layer 251. The first optical member 254 is disposed so as not to be in contact with the phosphor layer 251.

The first optical member 254 is disposed so as to incline with respect to the front surface 2511 of the phosphor layer 251. The angle of the first optical member 254 with respect to the front surface 2511 of the phosphor layer 251 is set at an acute angle.

The first optical member 254 includes a light-transmissive substrate 2541, a first optical layer 2542, and a fifth optical layer 2543. The light-transmissive substrate 2541 is made, for example, of glass.

The fifth optical layer 2543 is provided at the outer surface of the light-transmissive substrate 2541, that is, on the side facing the light source 22. The fifth optical layer 2543 is a polarization separation layer having polarization separation characteristics that causes P-polarized light (light having first wavelength band and polarized in first direction) out of light having the blue wavelength band to pass through the fifth optical layer 2543 and S-polarized light (light having first wavelength band and polarized in second direction different from first direction) to be reflected to separate the light having the blue wavelength band into the P-polarized light and the S-polarized light.

In the present embodiment, the light source 22 is configured to output P-polarized light with respect to the fifth optical layer 2543 as the excitation light EL. The excitation light EL outputted from the light source 22 therefore passes through the fifth optical layer 2543.

The excitation light EL having passed through the fifth optical layer 2543 enters the inner surface of the light-transmissive substrate 2541, that is, the first optical layer 2542 provided on the side facing the phosphor layer 251. The first optical layer 2542 is formed of a dichroic layer characterized in that it transmits the excitation light EL incident from the light source 22 and reflects the fluorescence YL. The first optical layer 2542 faces the support surface 2521 of the substrate 252. The excitation light EL passes through the first optical member 254 and enters the phosphor layer 251.

The second optical member 255 includes a base 2551 and a second optical layer 2552. The material of which the base 2551 is made is, for example, glass. The second optical layer 2552 is formed at the inner surface of the base 2551. The second optical layer 2552 is formed, for example, of a metal or dielectric layer.

The second optical member 255 is disposed so as to intersect with the support surface 2521 of the substrate 252 and the first optical member 254. The second optical member 255 is so disposed that the second optical layer 2552 intersects with the support surface 2521 and the first optical layer 2542. The second optical member 255 may be perpendicular to the support surface 2521 of the substrate 252 and the first optical member 254. The second optical layer 2552 may be perpendicular to the support surface 2521 and the first optical layer 2542. The second optical member 255 is so disposed that the thickness direction thereof coincides with the axis-Z direction. The second optical member 255 is disposed in the vicinity of the side +Z of the phosphor layer 251. Part of the fluorescence YL emitted from the phosphor layer 251 toward the side +Z is therefore reflected off the second optical member 255.

For example, even when the first component EL1a is incident on the second optical member 255, the second optical member 255 reflects the first component EL1a to cause it to enter the phosphor layer 251.

The second optical member 255 is a plate having a trapezoidal shape.

The second optical member 255 has a first end surface 55a, which forms the upper bottom of the trapezoidal shape, a second end surface 55b, which forms the lower bottom of the trapezoidal shape, a third end surface 55c, which connects the first end surface 55a to the second end surface 55b on the side and a fourth end surface 55d, which connects the first end surface 55a to the second end surface 55b on the side −X, as shown in FIG. 3. The first end surface 55a, the second end surface 55b, the third end surface 55c and the fourth end surface 55d are each a flat surface. The third end surface 55c is the surface facing the substrate 252. The fourth end surface 55d of the base 2551 is the surface opposite from the third end surface 55c. The first optical member 254 is in contact with the fourth end surface 55d. The first optical member 254 is placed on the fourth end surface 55d. The first optical layer 2542 is in contact with the fourth end surface 55d. The light-transmissive substrate 2541 is placed on the fourth end surface 55d via the first optical layer 2542.

To use glass as the material of the base 2551, a chamfering process of removing sharp portions is required to prevent chipping. In the present embodiment, the second optical member 255, which is a plate having a trapezoidal shape, requires no chamfering, whereby the processability of the base 2551 is improved.

In the present embodiment, part of the second optical member 255 is buried in the substrate 252. The second optical member 255 is therefore firmly supported by the substrate 252.

Part of a +X-side end portion of the second optical member 255 is fitted into a groove 2524 formed in the support surface 2521 of the substrate 252. The gap between the second optical member 255 and the groove 2524 may be filled with an adhesive.

Specifically, the second optical member 255 is so configured that the entire first end surface 55a and third end surface 55c and part of the second end surface 55b are fitted into the groove 2524. An end edge 55d1 of the fourth end surface 55d, the end edge located in a position closest to the side −Y and extending along the Z direction, is flush with the support surface 2521 of the substrate 252. The fourth end surface 55d is thus smoothly connected to the support surface 2521 of the substrate 252. Furthermore, the second end surface 55b is flush with an end surface 52 of the substrate 252 on the side +Y.

The third optical member 256 has the same configuration as the second optical member 255.

That is, the third optical member 256 includes a base 2561 and a third optical layer 2562. The third optical layer 2562 is formed at the inner surface of the base 2561. The third optical layer 2562 is formed, for example, of a metal or dielectric layer.

The third optical member 256 is so disposed as to intersect with the support surface 2521 of the substrate 252 and the first optical member 254 and face the second optical member 255. The third optical member 256 is so disposed that the third optical layer 2562 intersects with the support surface 2521 and the first optical layer 2542 and faces the second optical layer 2552. The third optical member 256 may be perpendicular to the support surface 2521 of the substrate 252 and the first optical member 254. The third optical layer 2562 may be perpendicular to the support surface 2521 and the first optical layer 2542. The third optical member 256 is so disposed that the thickness direction thereof coincides with the axis-Z direction. The third optical member 256 is disposed in the vicinity of the side of the phosphor layer 251. The fluorescence YL emitted from the phosphor layer 251 toward the side −Z and incident on the third optical member 256 is therefore reflected off the third optical member 256. For example, even when the excitation light EL is incident on the third optical member 256 for some reason, the third optical member 256 reflects the excitation light EL to cause it to enter the phosphor layer 251.

The third optical member 256 is a plate having the same trapezoidal shape as the shape of the second optical member 255.

The third optical member 256 has a first end surface 56a, which forms the upper bottom of the trapezoidal shape, a second end surface 56b, which forms the lower bottom of the trapezoidal shape, a third end surface 56c, which connects the first end surface 56a to the second end surface 56b on the side +X, and a fourth end surface 56d, which connects the first end surface 56a to the second end surface 56b on the side −X. The first end surface 56a, the second end surface 56b, the third end surface 56c, and the fourth end surface 56d are each a flat surface. The third end surface 56c is the surface facing the substrate 252. The fourth end surface 56d of the base 2561 is the surface opposite from the third end surface 56c. The first optical member 254 is in contact with the fourth end surface 56d. The first optical member 254 is placed on the fourth end surface 56d. The first optical layer 2542 is in contact with the fourth end surface 56d. The light-transmissive substrate 2541 is placed on the fourth end surface 56d via the first optical layer 2542.

In the present embodiment, part of the third optical member 256 is buried in the substrate 252, so that the third optical member 256 is firmly supported by the substrate 252.

Part of a +X-side end portion of the third optical member 256 is fitted into the groove 2524 formed in the support surface 2521 of the substrate 252. The gap between the third optical member 256 and the groove 2524 may be filled with an adhesive.

Specifically, the third optical member 256 is so configured that the entire first end surface 56a and third end surface 56c and part of the second end surface 56b are fitted into the groove 2524. An end edge 56d1 of the fourth end surface 56d, the end edge located in a position closest to the side −Y and extending along the Z direction, is flush with the support surface 2521 of the substrate 252. The fourth end surface 56d is thus smoothly connected to the support surface 2521 of the substrate 252. Furthermore, the second end surface 56b is flush with the end surface 52 of the substrate 252 on the side +Y.

In the present embodiment, the first optical member 254 is supported by the second optical member 255 and the third optical member 256. The first optical member 254 is bonded and fixed to the second optical member 255 and the third optical member 256.

Specifically, the first optical member 254 is so provided as to form a bridge between the fourth end surface 55d of the second optical member 255 and the fourth end surface 56d of the third optical member 256. An inner end edge 54a of the first optical member 254 is in contact with the support surface 2521 of the substrate 252 on the side −Y.

Based on the configuration described above, the side −Y, which is opposite from the aperture 260, of the wavelength converter 25 in the present embodiment is closed by the substrate 252, the first optical member 254, the second optical member 255, and the third optical member 256. The wavelength converter 25 therefore prevents leakage of the fluorescence YL from the side opposite from the aperture 260 and can efficiently emit the light only via the aperture 260.

The excitation light EL enters the phosphor layer 251 an such a way that the focusing optical system 24 focuses the excitation light EL on the front surface 2511, as shown in FIGS. 4 and 5. That is, the excitation light EL enters the phosphor layer 251 with the angle of incidence of the excitation light EL with respect to a normal to the front surface 2511 of the phosphor layer 251 being angularly distributed. In the present embodiment, the first optical member 254 is disposed so as to incline with respect to the front surface 2511 of the phosphor layer 251. The excitation light EL is therefore incident on the first optical layer 2542 over a predetermined angular range that will be described later. The predetermined angular range is defined by the range of the angle of incidence of the excitation light EL with respect to a normal to the first optical layer 2542.

The first optical layer 2542 in the present embodiment receives light having the blue wavelength band to which the excitation light EL belongs in accordance with dependence on the angle of incidence of the light. Specifically, the first optical layer 2542 is characterized in that it transmits components of the light having the blue wavelength band and incident at angles of incidence that fall within the predetermined angular range and reflects components incident at angles of incidence greater than those that fall within the predetermined angular range. The predetermined angular range is set in consideration of a first angle between a plane along the first optical layer 2542 of the first optical member 254 and a plane along the front surface 2511 and the angular distribution of the excitation light EL.

For example, let $\theta$ be the first angle, and $\pm\alpha$ be the angular distribution of the excitation light EL, and the range of the angle of incidence of the excitation light EL with respect to a normal to the first optical layer 2542 ranges from $-(\alpha+\theta)°$ to $+(\alpha+\theta)°$. In general film design, the maximum in the range of the angle of incidence is taken into account. That is, the first optical layer 2592 is designed so as to be characterized in that it transmits the excitation light EL incident at angles of incidence within the range between $\pm(\alpha+\theta)°$ and reflects the excitation light EL incident at the other angles of incidence. For example, when the first angle $\theta=15°$ and the angular distribution $\alpha=15°$, the first optical layer 2542 transmits the excitation light EL incident at angles of incidence within the range between $\pm30°$ and reflects the excitation light EL incident at the larger angles of incidence. In this case, the predetermined angular range described above for the first optical layer 2542 is $\pm30°$.

Since the excitation light EL is incident on the first optical layer 2542 at angles of incidence that fall within the predetermined angular range as described above, the excitation light EL can pass through the first optical layer 2542. An excitation light incident region (light incident region) Ls is thus formed at the front surface 2511 of the phosphor layer 251. The excitation light incident region Ls corresponds to a radiation spot formed by the excitation light EL on the front surface 2511.

The phosphor layer excited by the excitation light EL incident on the excitation light incident region Ls and radiates the fluorescence YL in the form of Lambertian emission. The area of the region from which the fluorescence YL is emitted is greater than the area of the excitation light incident region Ls.

For example, part of the fluorescence YL emitted in the form of Lambertian emission via the front surface 2511 is incident on the first optical member 254 so disposed as to face the front surface 2511. The fluorescence YL incident on the first optical member 254 is reflected off the first optical layer 2542. Part of the fluorescence YL reflected off the first optical layer 2542 travels toward the aperture 260, passes through the fourth optical layer 257, which covers the aperture 260, and exits out of the wavelength converter 25.

Part of the fluorescence YL reflected off the first optical layer 2542 is incident on the support surface 2521 of the substrate 252 and reflected off the mirror layer 253 formed at the support surface 2521. The fluorescence YL reflected off the mirror layer 253 exits out of the fourth optical layer 257 via the aperture 260 or is incident on the first optical member 254 again.

Part of the fluorescence YL reflected off the first optical layer 2542 is caused to return into the phosphor layer 251. The phosphor layer 251 in the present embodiment contains the plurality of pores K. The fluorescence YL caused to return into the phosphor layer 251 is therefore scattered by the pores K and exits out of the phosphor layer 251 in the form of Lambertian emission again.

Part of the fluorescence YL emitted in the form of Lambertian emission via the side surface 2512 of the phosphor layer 251 is incident on the second optical member 255 or the third optical member 256 via the mirror layer 253 or directly incident on the second optical member 255 or the third optical member 256. The fluorescence YL is reflected off the second optical member 255 or the third optical member 256 so as to be incident on and reflected off the first optical member 254 again.

Part of the fluorescence YL generated in the phosphor layer 251 propagates in the direction away from the aperture 260 (toward side −Y) but is repeatedly reflected and eventually exits out of the fourth optical layer 257 via the aperture 260. The wavelength converter 25 in the present embodiment thus allows the fluorescence YL generated in the phosphor layer 251 to exit out of the fourth optical layer 257 via the aperture 260 toward the side +Y.

In this process, part of the excitation light EL is backscattered by the phosphor layer 251. The excitation light EL backscattered by the phosphor layer 251 forms unpolarized light that is a mixture of S-Polarized light and P-Polarized light. The excitation light EL backscattered by the phosphor layer 251 is hereinafter referred to as backscattered light EL1. The backscattered light EL1 is incident on the first optical layer 2542, which faces the phosphor layer 251.

Exiting in a variety of directions, the backscattered light EL1 is incident on the first optical layer 2542 at a variety of angles of incidence. Since the first optical layer 2542 receives the excitation light EL in accordance with dependence on the angle of incidence of the excitation light EL as described above, the first optical layer 2542 also receives the backscattered light EL1 similarly in accordance with the dependence on the angle of incidence of the backscattered light EL1.

The first optical layer 2542 therefore reflects a first component EL1$a$, which is incident at angles incidence greater than those that fall within the predetermined angular range, and transmits a second component EL1$b$, which is incident at angles of incidence that fall within the predetermined angular range, out of the backscattered light EL1. The first component EL1$a$ reflected off the first optical layer 2542 enters the phosphor layer 25 and is reused to generate the fluorescence YL. Part of the first component EL1$a$ is incident on the fourth optical layer 257 provided at the aperture 260. Since the fourth optical layer 257 is characterized in that it reflects light having the blue wavelength band to which the excitation light EL belongs as described above, the first component EL1$a$ is reflected off the fourth optical layer 257, enters the phosphor layer 251, and is reused to generate the fluorescence YL.

Part of the first component EL1$a$ is incident on the second optical member 255 or the third optical member 256 via the mirror layer 253 or directly on the second optical member 255 or the third optical member 256. The first component EL1$a$ is reflected off the second optical member 255 or the third optical member 256, and therefore enters the phosphor layer 251 again, and is reused to generate the fluorescence YL.

The second component EL1$b$ having passed through the first optical layer 2542 passes through the light transmissive substrate 2541 and is incident on the first optical layer 2542. The second component EL1$b$ is unpolarized light. The second component EL1$b$ is therefore separated by the first optical layer 2542 into a P-polarized light component ELp and an S-polarized light component ELs. Specifically, out of the second component EL1$b$ incident on the first optical layer 2542, the S-polarized light component ELs is reflected off the first optical layer 2542, and the P-polarized light component ELp passes through the first optical layer 2542 and exits out of the first optical member 254.

The S-polarized light component ELs reflected off the first optical layer 2542 is incident again on the fourth optical layer 257 at angles of incidence that fall within the predetermined angular range. Therefore, the S-polarized light component ELs is reflected off the fourth optical layer 257, enters the phosphor layer 251, and is reused to generate the fluorescence YL. Part of the S-polarized light component ELs enters the phosphor layer 251 via the mirror layer 253, the second optical member 255, the third optical member 256, or the fourth optical layer 257 and is reused to generate the fluorescence YL.

In the wavelength converter 25 in the present embodiment, a −Y-side-portion of the phosphor layer 251, the portion opposite from the aperture 260, tends to confine heat and become hotter than the side facing the aperture 260, via which the fluorescence YL exits. In view of the fact described above, in the wavelength converter 25 in the present embodiment, the substrate 252, which supports the phosphor layer 251, has a shape elongated toward the side opposite from the aperture 260, as shown in FIGS. 3 and 5. Therefore, according to the wavelength converter 25 in the present embodiment, a side of the phosphor layer 251 that is the side opposite from the aperture 260 and tends to confine the heat can be efficiently cooled. The phosphor layer 251 can therefore be efficiently cooled.

In the wavelength converter 25 in the present embodiment, an area A1 of the front surface 2511 of the phosphor layer 251 is greater than an area A2 of the excitation light incident region Ls. Furthermore, in the wavelength converter 25 in the present embodiment, an area A3 of the aperture 260 is smaller than the area A2 of the excitation light incident region Ls by setting the angle between the plane along the first optical layer 2542 of the first optical member 254 and the plane along the front surface 2511 at a value, for example, greater than or equal to 10° but smaller than or equal to 40°.

That is, in the wavelength converter 25 in the present embodiment, the area A1 of the front surface 2511 of the phosphor layer 251 is greater than the area A2 of the excitation light incident region Ls, and the area A2 of the excitation light incident region Ls is greater than the area A3 of the aperture 260.

In the wavelength converter 25 in the present embodiment, the aperture 260 can be regarded as an apparent light emitting surface via which the fluorescence YL is emitted, so that the area A3 of the aperture 260 can be regarded as an apparent light emitting area via which the fluorescence YL is emitted.

The fluorescence YL emitted from the wavelength converter 25 enters the pickup optical system 26. The pickup optical system 26 is formed, for example, of pickup lenses 26$a$ and 26$b$. The pickup optical system 26 has the function of picking up and parallelizing the fluorescence YL emitted from the phosphor layer 251. The fluorescence YL parallelized by the pickup optical system 26 is hereinafter referred to as the illumination light WL.

The illumination light WL enters the optical integration system 35. The optical integration system 35 is formed, for example, of a first lens array 35$a$ and a second lens array 35$b$.

The first lens array 35$a$ includes a plurality of first lenslets 35$am$, and the second lens array 35$b$ includes a plurality of second lenslets 35$bm$.

The first lens array 35$a$ separates the illumination light WL into a plurality of thin light ray bundles. The first lenslets 35$am$ each bring the thin light ray bundle into focus at the corresponding second lenslet 35$bm$. The optical integration system 35, in cooperation with the superimposing lens 37, which will be described later, homogenizes the illuminance distribution in image formation regions of the light modulators 4R, 4G and 4B shown in FIG. 1, which are illumination receiving regions.

The illumination light WL having passed through the optical integration system 35 enters the polarization converter 36. The polarization converter 36 is formed, for example, of polarization separation films and retardation films (half-wave plates). The polarization converter 36 converts the polarization directions of the fluorescence YL into the polarization direction of one of the polarization light components.

The illumination light WL having passed through the polarization converter 36 enters the superimposing lens 37. The illumination light WL having exited out of the superimposing lens 37 enters the color separation system 3. The superimposing lens 37 superimposes the plurality of thin light ray bundles described above, which form the illumination light WL, on one another in the illumination receiving regions, that is, the image formation regions of the light modulators 4R, 4G and 4B so that the regions are uniformly illuminated.

Effects of Embodiment

The first light source apparatus 20 according to the present embodiment described above provides the following effects.

The first light source apparatus 20 according to the present embodiment includes the light source 22, which outputs excitation light EL, the phosphor layer 251, which has the front surface 2511 and generates the fluorescence YL by converting the excitation light EL incident on the front surface 2511 in terms of wavelength, the substrate 252, which has the support surface 2521, which supports the phosphor layer 251, the first optical member 254, which includes the first optical layer 2542, which transmits light having the first wavelength band and incident from the light source 22 and reflects the fluorescence YL, the first optical member 254 being so disposed that the first optical layer 2542 faces the support surface 2521, the second optical member 255, which includes the second optical layer 2552, which reflects the excitation light EL and the fluorescence YL and is so disposed that the second optical layer 2552 intersects with the support surface 2521 and the first optical layer 2542, the third optical member 256, which includes the third optical layer 2562, which reflects the excitation light EL and the fluorescence YL and is so disposed that the third optical layer 2562 intersects with the support surface 2521 and the first optical layer 2542 and faces the second optical layer 2552, and the fourth optical layer 257, which is provided so as to cover the aperture 260 formed by the substrate 252, the first optical member 254, the second optical member 255, and the third optical member 256, reflects the backscattered light EL1, and transmits the fluorescence YL. The first optical member 254 includes the fifth optical layer 2543, which is provided on the side facing the light source 22 and transmits the excitation light EL, and the first optical layer 2542 is provided on the side facing the phosphor layer 251 and reflects the backscattered light EL1, which is the excitation light EL having exited out of the phosphor layer 251. The area A1 of the front surface 2511 of the phosphor layer 251 is greater than the area A2 of the excitation light incident region Ls, of the front surface 2511, on which the excitation light EL is incident, and the area A2 of the excitation light incident region Ls is greater than the area A3 of the aperture 260.

The first light source apparatus 20 according to the present embodiment allows part of the backscattered light EL1 produced by the phosphor layer 251 to be reflected back into the phosphor layer 251. Part of the backscattered light EL1 can thus be reused to excite the phosphor layer 251. The efficiency at which the excitation light EL is used can therefore be improved, whereby the fluorescence conversion efficiency in the phosphor layer 251 can be improved.

Furthermore, since the fluorescence YL exits via the aperture 260, which has an area smaller than the area of the excitation light incident region Ls, on which the excitation light EL is incident, the apparent light emitting area via which the fluorescence YL is emitted is smaller than that in a configuration in which the fluorescence YL is directly extracted from the excitation light incident region Ls. The etendue of the fluorescence YL can thus be reduced.

In the first light source apparatus 20 according to the present embodiment, the etendue of the fluorescence YL can be reduced without reduction in the area, of the phosphor layer 251, on which the excitation light EL is incident, so that the optical density of the excitation light EL does not increase at the front surface 2511 of the phosphor layer 251. A decrease in the fluorescence conversion efficiency due to an increase in the optical density can therefore be suppressed.

The first light source apparatus 20 according to the present embodiment therefore allows reduction in the etendue of the fluorescence YL and generation of bright fluorescence YL with the optical density of the excitation light EL suppressed.

In the first light source apparatus 20 according to the present embodiment, the excitation light EL is incident on the front surface 2511 of the phosphor layer 251 with the angle of incidence of the excitation light EL with respect to a normal to the front surface 2511 angularly distributed, and out of the light having the blue wavelength band to which the excitation light EL belongs, the first optical layer 2542 transmits the second component EL1b incident on the first optical member 254 at angles of incidence that fall within a predetermined angular range and reflects the first component EL1a incident on the first optical member 254 at angles of incidence greater than those that fall within the predetermined angular range.

The configuration described above allows the excitation light EL to pass through the first optical layer 2542 and efficiently enter the phosphor layer 251. Furthermore, the first optical layer 2542 can reflect the first component EL1a of the backscattered light EL1 to cause the reflected first component EL1a to enter the phosphor layer 251 and to be reused to generate the fluorescence YL. The efficiency at which the excitation light EL is used can therefore be improved.

In the first light source apparatus 20 according to the present embodiment, the fifth optical layer 2543 reflects the S-polarized blue light.

According to the configuration described above, the fifth optical layer 2543 can reflect the S-polarized light component ELs of the second component EL1b having passed through the first optical layer 2542 out of the backscattered light EL1 and cause the reflected S-polarized light component ELs to return toward the phosphor layer 251. The efficiency at which the excitation light EL is used can therefore be further improved.

In the first light source apparatus 20 according to the present embodiment, the excitation light EL reflected off the first optical member 254, the second optical member 255, the third optical member 256, and the fourth optical layer 257 enters the phosphor layer 251 and is converted into the fluorescence YL.

The configuration described above allows the excitation light EL to efficiently enter the phosphor layer 251. The efficiency at which the excitation light EL is used can therefore be improved.

The projector 1 according to the present embodiment described above provides the following effects.

The projector according to the present embodiment includes the first light source apparatus 20, the second light source apparatus 21, the light modulators 4B, 4G, and 4R, which modulate the blue light LB, the green light LG, and the red light LR from the first light source apparatus 20 or the second light source apparatus 21 in accordance with image information to form image light, and the projection optical apparatus 6, which projects the image light described above.

The projector 1 according to the present embodiment, which includes the first light source apparatus 20, which generates the high-luminance illumination light WL, can therefore form and project a high-luminance image.

The present disclosure has been described above with reference to an embodiment by way of example but is not necessarily limited to the embodiment described above, and a variety of changes can be made thereto to the extent that the changes do not depart from the substance of the present disclosure.

For example, the aforementioned embodiment has been described with reference to the case where a width of the rear surface 2513 of the phosphor layer 251, the width in the direction Z, is smaller than a width of the support surface 2521 located in the accommodation space S, the width in the direction Z, and the direction-Z width of the rear surface 2513 of the phosphor layer 251 may be equal to the direction-Z width of the support surface 2521 located in the accommodation space S. In this case, the side surface 2512 of the phosphor layer 251 is in contact with the second optical member 255 and the third optical member 256, so that the fluorescence YL emitted via the side surface 2512 is reflected off the second optical member 255 and the third optical member 256 back into the phosphor layer 251.

In the embodiment described above, the projector 1 including the three light modulators 4R, 4G, and 4B has been presented by way of example, and the present disclosure is also applicable to a projector that displays color video images via one light modulator. Furthermore, the light modulators are not limited to the liquid crystal panels described above and can instead, for example, be digital mirror devices.

In the embodiment described above, the light source apparatus according to the present disclosure is used in a projector by way of example, but not necessarily. The light source apparatus according to the present disclosure may be used as a lighting apparatus, such as a headlight of an automobile.

A light source apparatus according to an aspect of the present disclosure may have the configuration below.

The light source apparatus according to the aspect of the present disclosure includes a light source that outputs light having a first wavelength band and polarized in a first direction, a wavelength conversion layer that has a light incident surface and generates light having a second wavelength band different from the first wavelength band by converting in terms of wavelength the light having the first wavelength band and incident on the light incident surface, a substrate having a support surface that supports the wavelength conversion layer, a first optical member including a first optical layer that transmits the light having the first wavelength band and incident from the light source and reflects the light having the second wavelength band, the first optical member being so disposed that the first optical layer faces the support surface, a second optical member that includes a second optical layer that reflects the light having the first wavelength band and the light having the second wavelength band and is so disposed that the second optical layer intersects with the support surface and the first optical layer, a third optical member that includes a third optical layer that reflects the light having the first wavelength band and the light having the second wavelength band and is so disposed that the third optical layer intersects with the support surface and the first optical layer and faces the second optical layer, and a fourth optical layer that is provided so as to cover an aperture formed by the substrate, the first optical member, the second optical member, and the third optical member, reflects the light having the first wavelength band, and transmits the light having the second wavelength band. The first optical member includes a fifth optical layer that is provided on the side facing the light source and transmits the light having the first wavelength band and polarized in the first direction. The first optical layer is provided on the side facing the wavelength conversion layer and reflects part of the light having the first wavelength band and having exited out of the wavelength conversion layer. The area of the light incident surface of the wavelength conversion layer is greater than the area of a light incident region, of the light incident surface, on which the light having the first wavelength band is incident, and the area of the light incident region is greater than the area of the aperture.

In the light source apparatus according to the aspect of the present disclosure, the light having the first wavelength band may be incident on the wavelength conversion layer with the angle of incidence of the light with respect to a normal to the light incident surface of the wavelength conversion layer being angularly distributed, and the first optical layer may transmit the light having the first wavelength band incident on the first optical member at angles of incidence that fail within a predetermined angular range and reflect the light having the first wavelength band incident on the first optical member at angles of incidence greater than those that fall within the predetermined angular range.

In the light source apparatus according to the aspect of the present disclosure, the fifth optical layer may be configured to reflect the light having the first wavelength band and polarized in a second direction different from the first direction.

In the light source apparatus according to the aspect of the present disclosure, the light having the first wavelength band and reflected off the first optical member, the second optical member, the third optical member, and the fourth optical layer may enter the wavelength conversion layer and be converted into the light having the second wavelength band.

A projector according to another aspect of the present disclosure may have the configuration below.

The projector according to the other aspect of the present disclosure includes the light source apparatus according to the aforementioned aspect of the present disclosure, a light modulator that modulates light from the light source apparatus in accordance with image information, and a projection optical apparatus that projects the light modulated by the light modulator.

What is claimed is:
1. A light source apparatus comprising:
a light source configured to emit first light having a first wavelength band;

a wavelength conversion layer having a light incident surface, the wavelength conversion layer being configured to convert the first light which is incident on the light incident surface into second light having a second wavelength band different from the first wavelength band;

a substrate having a support surface configured to support the wavelength conversion layer;

a first optical member including a first optical layer configured to transmit the first light emitted from the light source and reflect the second light, the first optical layer facing the support surface;

a second optical member having a second optical layer configured to reflect the first light and the second light, the second optical layer intersecting with the support surface and the first optical layer;

a third optical member having a third optical layer configured to reflect the first light and the second light, the third optical layer intersecting with the support surface and the first optical layer and facing the second optical layer; and a fourth optical layer configured to cover an aperture formed by the substrate, the first optical member, the second optical member, and the third optical member, the fourth optical layer being configured to reflect the first light and transmit the second light, wherein the first light emitted from the light source is polarized in a first direction, the first optical member includes a fifth optical layer provided on a side facing the light source, the fifth optical layer being configured to transmit the first light polarized in the first direction, the first optical layer is provided on a side facing the wavelength conversion layer in the first optical member and is configured to reflect part of the first light emitted from the wavelength conversion layer, the fifth optical layer is configured to reflect the first light polarized in a second direction different from the first direction, a first area of the light incident surface of the wavelength conversion layer is greater than a second area of a light incident region, of the light incident surface, on which the first light is incident, and the second area of the light incident region is greater than a third area of the aperture.

2. The light source apparatus according to claim 1, wherein the first light is incident on the wavelength conversion layer with an incident angle of the light with respect to a normal to the light incident surface of the wavelength conversion layer being angularly distributed, and the first optical layer is configured to transmit the first light incident on the first optical member at first incident angles that fall within a predetermined angular range and is configured to reflect the first light incident on the first optical member at second incident angles greater than values that fall within the predetermined angular range.

3. The light source apparatus according to claim 1, wherein the fifth optical layer is configured to reflect the first light polarized in the second direction, out of the first light which is incident on the first optical member at the second incident angles and transmits the first optical layer.

4. The light source apparatus according to claim 1, wherein the first light reflected off the first optical member, the second optical member, the third optical member, and the fourth optical layer enters the wavelength conversion layer and is converted into the second light.

5. A projector comprising:

the light source apparatus according to claim 1;

a light modulator modulating light emitted from the light source apparatus; and a projection optical apparatus projecting the light modulated by the light modulator.

* * * * *